(12) United States Patent
Zedlitz et al.

(10) Patent No.: US 6,784,553 B2
(45) Date of Patent: Aug. 31, 2004

(54) SEMICONDUCTOR DEVICE WITH SELF-ALIGNED CONTACT AND METHOD FOR MANUFACTURING THE DEVICE

(75) Inventors: Ralf Zedlitz, Dresden (DE); Bruno Spuler, München (DE)

(73) Assignee: Infineon Technologies SC300 GmbH & Co. KG, Dresden (DE)

( * ) Notice: Subject to any disclaimer, the term of this patent is extended or adjusted under 35 U.S.C. 154(b) by 0 days.

(21) Appl. No.: 10/166,963

(22) Filed: Jun. 11, 2002

(65) Prior Publication Data

US 2002/0187630 A1 Dec. 12, 2002

(30) Foreign Application Priority Data

Jun. 11, 2001 (EP) .............................................. 01114141

(51) Int. Cl.[7] .............................................. H01L 21/48
(52) U.S. Cl. ....................... 257/774; 257/750; 438/629; 438/639
(58) Field of Search ................................ 257/774, 750; 438/629, 639, 637

(56) References Cited

U.S. PATENT DOCUMENTS 3,667,009 A * 5/1972 Rugg ........................ 257/358
5,384,287 A  1/1995 Fukase
5,792,703 A  8/1998 Bronner et al.
5,969,380 A * 10/1999 Seyyedy ..................... 257/295

FOREIGN PATENT DOCUMENTS

| DE | 199 58 905 C1 | 2/2001 |
| EP | 0 849 785 A2 | 6/1998 |
| JP | 5-166941 | 7/1993 |
| JP | 2001-102455 | 4/2001 |

* cited by examiner

Primary Examiner—Nathan J. Flynn
Assistant Examiner—Leonardo Andújar
(74) Attorney, Agent, or Firm—Laurence A. Greenberg; Werner H. Stemer; Ralph E. Locher

(57) ABSTRACT

A semiconductor device and a method for manufacturing the semiconductor device with a self-aligned contact, is described. A first conductor and a second conductor are formed on the surface of the semiconductor substrate. The first conductor and the second conductor are encapsulated with a first encapsulation and a second encapsulation, respectively. The first encapsulation and the second encapsulation contain titanium oxide, boron nitride, silicon carbide, magnesium oxide or carbon. The first encapsulation and the second encapsulation are suitable as a self-aligning etch mask for etching a self-aligned contact hole between the first conductor and the second conductor.

6 Claims, 2 Drawing Sheets

SEMICONDUCTOR DEVICE WITH SELF-ALIGNED CONTACT AND METHOD FOR MANUFACTURING THE DEVICE

BACKGROUND OF THE INVENTION

1. Field of the Invention

The present invention relates to a semiconductor device with a self-aligned contact and a method for manufacturing the semiconductor device with a self-aligned contact.

In the technical field of semiconductor devices, it is common and necessary to contact doped regions that are disposed in a semiconductor substrate. When two neighboring word lines are disposed on a surface of the semiconductor substrate and a doped region is disposed in the semiconductor substrate between the two neighboring word lines, it is known to encapsulate the word lines on their tops and side walls with a so-called liner as an etch resistant material to gain a self-aligned contact between the two word lines to the doped region.

The encapsulation for the word lines typically are formed of silicon nitride, the word lines typically are formed of doped poly silicon and an insulating layer covering the word lines and the substrate typically are formed of a silicon oxide.

The etch selectivity between the silicon oxide and the silicon nitride is nowadays not sufficient for modern semiconductor devices. While etching the insulating layer formed of silicon oxide with a roughly patterned resist mask, the encapsulation of the word lines directs the etching process self-aligned to the doped region between the neighboring word lines. During the process, the encapsulation of the word lines is etched as well and holes can be etched into the encapsulation resulting in damage to the word line or a short-circuit between the word line and the contact plug filled in between the two neighboring word lines for contacting the doped region in the substrate.

U.S. Pat. No. 5,792,703 describes a liner containing aluminum oxide as an etch mask for a gate stack.

U.S. Pat. No. 5,384,287 shows an additional silicon oxide layer between the poly silicon gate stack and the aluminum oxide liner.

2. Summary of the Invention

It is accordingly an object of the invention to provide a semiconductor device with a self-aligned contact and a method for manufacturing the device which overcomes the above-mentioned disadvantages of the prior art devices and methods of this general type, which prevents short circuits between neighboring conductors and reduces capacitive coupling between neighboring conductors.

With the foregoing and other objects in view there is provided, in accordance with the invention, a semiconductor device. The device contains a substrate having a surface and a first conductor disposed on the surface of the substrate. The first conductor has a first top surface and a first side wall. A second conductor is disposed on the surface of the substrate. The second conductor has a second top surface and a second side wall, and the first conductor and the second conductor are disposed next to each other. A first encapsulation is disposed on the first top surface and on the first side wall of the first conductor. A second encapsulation is disposed on the second top surface and on the second side wall of the second conductor. The first encapsulation or the second encapsulation contains titanium oxide, boron nitride, silicon carbide, magnesium oxide, carbon in a diamond like structure, or carbon in an amorphous structure.

The invented semiconductor device contains an encapsulation for a conductor. The encapsulation contains titanium oxide, boron nitride, silicon carbide, magnesium oxide, carbon in a diamond like structure, or carbon in an amorphous structure. The mentioned materials have the advantage of a high etch selectivity compared to silicon oxide. This enables a self-aligned contact with the encapsulation as a self-aligning etch mask. Due to the high etch selectivity between the mentioned materials and silicon oxide, the encapsulation, namely the liner, can be built thinner while still providing the same etch resistivity as materials known from the prior art. The thinner liner enables the first conductor, the second conductor, or the contact plug between the first and the second conductor to be built with a larger cross-section area resulting in a lower resistance.

Another advantage of the invention is that a malfunction of the semiconductor device due to a short circuit between the first conductor or the second conductor with the contact plug can be avoided due to the improved etch resistivity of the new liner materials.

According to an embodiment of the present invention a third encapsulation is disposed on the first top surface and on the first side wall of the first conductor between the first conductor and the first encapsulation. The third encapsulation is disposed between the first conductor and the first encapsulation. The third encapsulation enables another material with a different dielectric constant to be disposed between the first conductor and a contact plug.

According to another embodiment of the present invention the first encapsulation contains a first dielectric constant and the third encapsulation contains a second dielectric constant, whereby the second dielectric constant is less then the first dielectric constant. This reduces the capacitive coupling between the first conductor and a contact plug.

In a further embodiment of the present invention the third encapsulation contains silicon oxide. Silicon oxide provides a dielectric constant of approximately 3.9, which can be used to reduce the capacitive coupling between the first conductor and the contact plug. In a preferred embodiment of the present invention, a contact plug is disposed on the surface of the semiconductor substrate between the first conductor and the second conductor. The contact plug is capable of electrically contacting a doped region in the substrate, which is disposed between the first conductor and the second conductor while maintaining the isolation between the first conductor, the second conductor and the contact plug.

With the foregoing and other objects in view there is provided, in accordance with the invention, a method for manufacturing a semiconductor device with a self-aligned contact. The method includes providing a semiconductor substrate having a surface and forming a first conductor on the surface of the substrate. The first conductor has a first top surface and a first side wall. A second conductor is formed on the surface of the substrate, the second conductor has a second top surface and a second side wall. A first encapsulation is disposed on the first top surface and on the first side wall of the first conductor. A second encapsulation is disposed on the second top surface and on the second side wall of the second conductor. The first encapsulation or the second encapsulation contains titanium oxide, boron nitride, silicon carbide, magnesium oxide, carbon in a diamond like structure, or carbon in an amorphous structure.

According to an embodiment of the present invention the first conductor and the second conductor are disposed on the surface of the semiconductor before the first encapsulation and the second encapsulation are disposed on the conductors.

A further embodiment of the present invention contains the step of etching a contact hole between the first conductor and the second conductor using the first encapsulation and the second encapsulation as a self-aligning etch mask. The contact hole is etched for receiving a contact plug. The self-aligning of the contact hole is enabled by the first encapsulation and the second encapsulation that direct the etching process—for etching the contact hole—between the first conductor and the second conductor towards the surface of the semiconductor. The first conductor and the second conductor are covered by the first encapsulation and the second encapsulation so that they are not etched.

In a further embodiment of the invention the step of filling the contact hole with a contact plug between the first conductor and the second conductor is performed. The contact plug is a self-aligned contact plug between the first conductor and the second conductor and contacts a doped region that is disposed between the first conductor and the second conductor in the substrate.

Another embodiment of the invention contains the step of disposing a third encapsulation on the first top surface and on the first side wall of the first conductor before the first encapsulation is disposed on the first conductor. This process step builds a third encapsulation between the first conductor and the first encapsulation. The third encapsulation can advantageously contain a material with a low dielectric constant near 1. For example silicon oxide is suitable as a material for the third encapsulation providing a dielectric constant of roughly 3.9.

According to another embodiment of the invention the first encapsulation is deposited as a titanium layer and is oxidized in an oxygen-containing atmosphere to titanium oxide. This enables a process step for depositing a titanium layer, which is oxidized afterwards. Also a process step for depositing the first encapsulation or the second encapsulation or the third encapsulation with the desired stoichiometry is suitable to manufacture the inventive configuration.

Other features which are considered as characteristic for the invention are set forth in the appended claims.

Although the invention is illustrated and described herein as embodied in a semiconductor device with a self-aligned contact and a method for manufacturing the device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
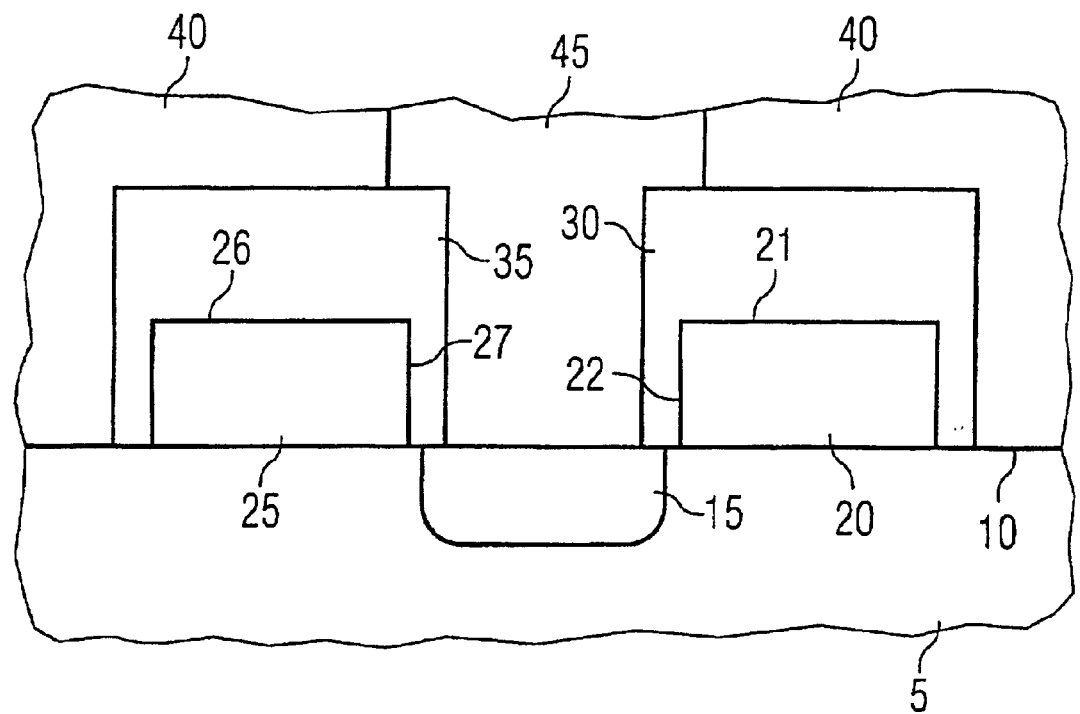
FIG. 1 is a diagrammatic, sectional view through a substrate with a first conductor and a second conductor that are encapsulated by an encapsulation according to the invention.

Referring now to the figures of the drawing in detail and first, particularly, to FIG. 1 thereof, there is shown a semiconductor substrate 5 with a surface 10. On the surface 10 of the semiconductor substrate 5, a first conductor 20 and a second conductor 25 are disposed. The first conductor 20 contains a first top surface 21 and a first side wall 22. The second conductor 25 contains a second top surface 26 and a second side wall 27. The first conductor 20 and the second conductor 25 are separated from each other and a doped region 15 is disposed in the substrate 5 between the first conductor 20 and the second conductor 25. The first conductor 20 is encapsulated with a first encapsulation 30, which is disposed on the first top surface 21 and the first side wall 22. The second conductor 25 is encapsulated by a second encapsulation 35, which is disposed on a second top surface 26 and the second side wall 27. The first encapsulation 30 and the second encapsulation 35 and the surface 10 of the substrate 5 are covered with an isolating layer 40. In the isolating layer 40, a contact hole is formed and the contact hole is filled to form a contact plug 45. The contact plug 45 is disposed on top of the doped region 15, which is disposed between the first conductor 20 and the second conductor 25. For example the substrate 5 is formed of silicon. The doped region 15 is a silicon doped region, doped with boron, phosphor, or arsenide. The first conductor 20 and the second conductor 25 are a gate stack or a word line containing doped silicon. In this case the first conductor 20 and the second conductor 25 are a first and a second conductor. The isolating layer 40 is formed of a doped silicate glass such as phosphorous silicate glass, boron silicate glass or boron phosphorous silicate glass. The first encapsulation 30 and the second encapsulation 35 contain titanium oxide, boron nitride, or silicon carbide respectively. For example the thickness of the first encapsulation 30 is bigger on top of the first conductor 20 compared to the thickness of the first encapsulation 30 on the side wall of the first conductor 20. This is useful because the process for etching the contact hole for the contact plug 45 is a directed etch process which is performed roughly perpendicular to the surface 10 of the substrate 5. As a result, the etch attack of the first encapsulation 30 is greater for the part on top of the first conductor 20 compared to the part on the side walls of the first conductor 20.

Figure 2:
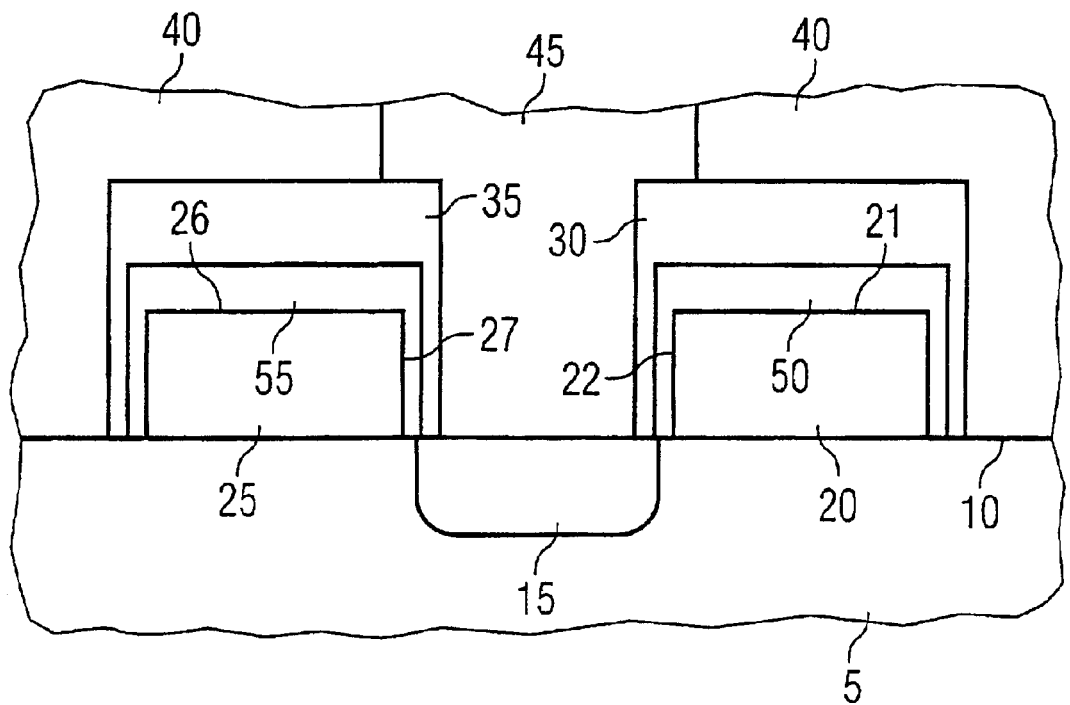
FIG. 2 is a sectional view of the substrate with the first conductor and the second conductor that contain an additional encapsulation.

According to FIG. 2 a second embodiment of the present invention is shown. Compared to FIG. 1 an additional third encapsulation 50 is disposed between the first conductor 20 and the first encapsulation 30. Additionally a fourth encapsulation 55 is disposed on top and on the side walls of the second conductor 25 between the second conductor 25 and the second encapsulation 35. For example the third encapsulation 50 and the fourth encapsulation 55 are formed of a material with a low dielectric constant near 1. For example silicon oxide with a dielectric constant of roughly 3.9 is suitable as a material for the third encapsulation 50 and the fourth encapsulation 55. The third encapsulation 50 and the fourth encapsulation 55 can reduce the electronic coupling between the first conductor 20 and the contact plug 45 or between the second conductor 25 and the contact plug 45. This is for example useful, when different electronic signals propagate on the first and the second electric conductor 20, 25.

Figure 3:
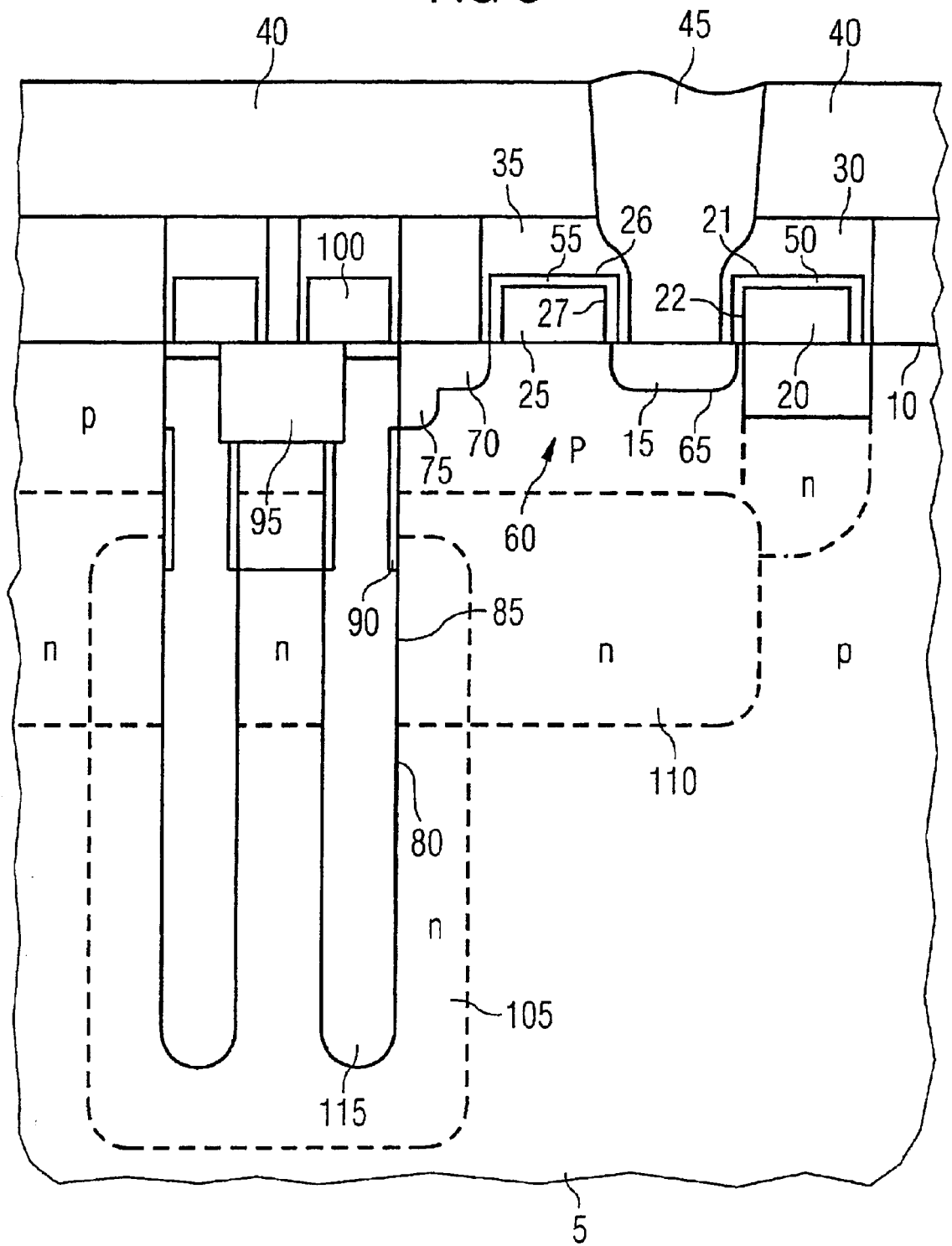
FIG. 3 is a cross-sectional view of a semiconductor dynamic random access memory containing a transistor and a trench capacitor.

FIG. 3 shows a third embodiment of the invention through a cross section of a semiconductor dynamic random access memory (DRAM) containing a transistor 60 and a capacitor 80. FIG. 3 shows the substrate 5 with the surface 10. On the surface 10, the first conductor 20 with the first top surface 21 and with the first side wall 22 is disposed. The second conductor 25 is disposed on the surface 10. The second conductor 25 contains the top surface 26 and the side wall 27. Between the first conductor 20 and the second conductor 25, the doped region 15 is disposed in the substrate 5.

For example the second conductor 25 is a gate electrode of the transistor 60, which further contains a first doped region 65 that is equivalent to the doped region 15 and the transistor 60 also has a second doped region 70 that is disposed in the substrate 5. For example a gate oxide is disposed between the substrate 5 and the second conductor 25 so that the second conductor 25 can act as the gate electrode to control a current flowing from the first doped region 65 to the second doped region 70.

The second doped region 70 is connected to an out-diffusion 75 that is also disposed in the substrate 5. Next to the out-diffusion 75, a trench 85 is formed in the substrate 5. In the trench 85, the trench capacitor 80 is disposed, which contains an isolation collar 90. On top of the trench 85 a shallow trench isolation 95 is disposed. On top of the shallow trench isolation 95 a passing word line 100 is disposed.

The trench 85 is filled with a conducting trench fill 115 that forms an inner electrode of the trench capacitor 80. An outer electrode of the trench capacitor 80 is disposed as a buried plate 105 in the substrate 5. The buried plate is for example a n-doped region. The n-doped regions 105 of neighboring trench capacitors are connected together with a buried layer 110 that is disposed as an n-doped layer in the substrate 5. The substrate 5 for example is formed of a p-doped silicon.

Between the first encapsulation 30 and the first conductor 20 the third encapsulation 50 is disposed. Between the second conductor 25 and the second encapsulation 35 the fourth encapsulation 55 is disposed. On top of the first encapsulation 30 and the second encapsulation 35 the isolation layer 40 is disposed. The contact plug 45 is disposed on top of the doped region 15 to contact the doped region 15. The contact plug 45 for example is capable of building an electric contact between the doped region 15 and a bit line which can be disposed on the isolation layer 40.

What is claimed is:

1. A semiconductor device, comprising:
   a substrate having a surface;
   a first conductor disposed on said surface of said substrate, said first conductor having a first top surface and a first side wall;
   a second conductor disposed on said surface of said substrate, said second conductor having a second top surface and a second side wall, said first conductor and said second conductor being disposed next to each other, with said first and second side walls of said first and second conductors facing each other;
   a first encapsulation disposed on said first top surface and on said first side wall of said first conductor;
   a second encapsulation disposed on said second top surface and on said second side wall of said second conductor, said first encapsulation and said second encapsulation containing a material selected from the group consisting of titanium oxide, magnesium oxide, carbon in a diamond like structure, and carbon in an amorphous structure, and each said first encapsulation and said second encapsulation having a substantially constant thickness from said first and second top surface, respectively, to said substrate;
   a third encapsulation disposed on said first top surface and on said first side wall of said first conductor between said first conductor and said first encapsulation;
   a fourth encapsulation disposed on said first top surface and on said first side wall of said second conductor between said second conductor and said second encapsulation;
   said third encapsulation and said fourth encapsulation containing silicon dioxide;
   said third encapsulation and said fourth encapsulation each having a respective top surface and a respective side wall facing each other and extending along the respective facing side wall of said conductors from the respective top surfaces of said conductors to said surface of said substrate;
   said first and second encapsulations extending along the respective facing side wall of said third and fourth encapsulations from the respective top surfaces of said third and fourth encapsulations to said surface of said substrate; and
   a contact plug disposed on said surface of said semiconductor substrate between said first encapsulation and said second encapsulation.

2. The semiconductor device according to claim 1, wherein said first encapsulation has a first dielectric constant and said third encapsulation has a second dielectric constant being less then said first dielectric constant.

3. A method for manufacturing a semiconductor device with a self-aligned contact, which comprises the steps of:
   providing a semiconductor substrate having a surface;
   forming a first conductor on the surface of the substrate, the first conductor having a first top surface and a first side wall;
   forming a second conductor on the surface of the substrate, the second conductor having a second top surface and a second side wall, wherein the first and second conductors are disposed next to each other and the first and second side walls face each other;
   disposing a first encapsulation on the first top surface and on the first side wall of the first conductor;
   disposing a second encapsulation on the second top surface and on the second side wall of the second conductor;
   forming one of the first encapsulation and the second encapsulation from a material selected from the group consisting of titanium oxide, boron nitride, silicon carbide, magnesium oxide, carbon in a diamond like structure, and carbon in an amorphous structure, with the first encapsulation and the second encapsulation having a substantially constant thickness from the first and second top surface, respectively, to the substrate;
   forming a third encapsulation on the first top surface and on the first side wall of the first conductor between the first conductor and the first encapsulation;
   forming a fourth encapsulation on the first top surface and on the first side wall of the second conductor between the second conductor and the second encapsulation, with the third encapsulation and the fourth encapsulation containing silicon dioxide;
   thereby forming each of the third encapsulation and the fourth encapsulation with a respective top surface and a respective side wall facing each other and extending along the respective facing side walls of the conductors from the respective top surfaces of the conductors to the surface of the substrate;
   thereby forming the first and second encapsulations to extend along the respective facing side walls of the third and fourth encapsulations from the respective top surfaces of the third and fourth encapsulations to the surface of the substrate; and forming a contact plug on the surface of the semiconductor substrate between the first encapsulation and the second encapsulation.

4. The method according to claim 3, which comprises etching a contact hole between the first conductor and the second conductor using the first encapsulation and the second encapsulation as a self-aligning etch mask.

5. The method according to claim 4, which comprises forming the contact plug in the contact hole between the first conductor and the second conductor.

6. The method according to claim 3, which comprises:
depositing a titanium layer for forming the first encapsulation; and
oxidizing the titanium layer in an oxygen containing atmosphere to form titanium oxide.

* * * * *